United States Patent
Yuan et al.

(10) Patent No.: US 11,528,829 B2
(45) Date of Patent: Dec. 13, 2022

(54) OVERALL EFFICIENT HEAT DISSIPATION SYSTEM FOR HIGH POWER DENSITY CABINET

(71) Applicants: BEIHANG UNIVERSITY, Beijing (CN); Weixing Yuan, Beijing (CN); Tongzhi Yang, Beijing (CN); Kexian Ren, Beijing (CN); Bo Yang, Beijing (CN); Ze Miao, Beijing (CN)

(72) Inventors: Weixing Yuan, Beijing (CN); Tongzhi Yang, Beijing (CN); Kexian Ren, Beijing (CN); Bo Yang, Beijing (CN); Ze Miao, Beijing (CN)

(73) Assignee: BEIHANG UNIVERSITY, Beijing (CN)

(*) Notice: Subject to any disclaimer, the term of this patent is extended or adjusted under 35 U.S.C. 154(b) by 0 days.

(21) Appl. No.: 17/624,139

(22) PCT Filed: Jun. 30, 2020

(86) PCT No.: PCT/CN2020/099583
§ 371 (c)(1),
(2) Date: Dec. 30, 2021

(87) PCT Pub. No.: WO2021/000873
PCT Pub. Date: Jan. 7, 2021

(65) Prior Publication Data
US 2022/0210954 A1 Jun. 30, 2022

(30) Foreign Application Priority Data
Jul. 1, 2019 (CN) .......................... 201910586668.1

(51) Int. Cl.
*H05K 7/20* (2006.01)

(52) U.S. Cl.
CPC ..... *H05K 7/20818* (2013.01); *H05K 7/20309* (2013.01); *H05K 7/20318* (2013.01);
(Continued)

(58) Field of Classification Search
CPC ........... H05K 7/20818; H05K 7/20309; H05K 7/20318; H05K 7/20327; H05K 7/20354; H05K 7/20736
See application file for complete search history.

(56) References Cited

U.S. PATENT DOCUMENTS

2017/0227259 A1* 8/2017 Lin .......................... F24F 3/044
2019/0178548 A1* 6/2019 Lin ............................ F25B 1/00

FOREIGN PATENT DOCUMENTS

| CN | 101336069 A | 12/2008 |
|---|---|---|
| CN | 101619879 A | 1/2010 |

(Continued)

OTHER PUBLICATIONS

JP-H1082566-A Translation (Year: 1998).*
(Continued)

*Primary Examiner* — David J Teitelbaum
(74) *Attorney, Agent, or Firm* — Anova Law Group, PLLC

(57) ABSTRACT

An overall efficient heat dissipation system for a high power density cabinet comprises a pump-driven two-phase circulation loop high-power-chip direct heat dissipation system and a cabinet air-cooling system. The cabinet air-cooling system comprises a refrigerant circulation loop and a cabinet internal air circulation loop. The refrigerant circulation loop includes a pump-driven two-phase circulation loop and a vapor compression circulation loop. The pump-driven two-phase circulation loop high-power-chip direct heat dissipation system performs fixed-point heat dissipation for main heating elements, such as CPU and GPU, in a server, and the (Continued)

cabinet air-cooling system performs air-cooling heat dissipation for other heating elements in the server.

8 Claims, 7 Drawing Sheets

(52) U.S. Cl.
CPC ..... *H05K 7/20327* (2013.01); *H05K 7/20354* (2013.01); *H05K 7/20736* (2013.01)

(56) References Cited

FOREIGN PATENT DOCUMENTS

| | | | | |
|---|---|---|---|---|
| CN | 106016456 A | | 10/2016 | |
| CN | 109631560 A | | 4/2019 | |
| CN | 110278691 A | | 9/2019 | |
| JP | H1082566 A | * | 3/1998 | ...... F25B 2400/0401 |
| JP | 2015005677 A | | 1/2015 | |
| WO | 0058673 A1 | | 10/2000 | |

OTHER PUBLICATIONS

The World Intellectual Property Organization (WIPO) International Search Report for PCT/CN2020/099583 dated Sep. 16, 2020 5 Pages (with translation).

* cited by examiner

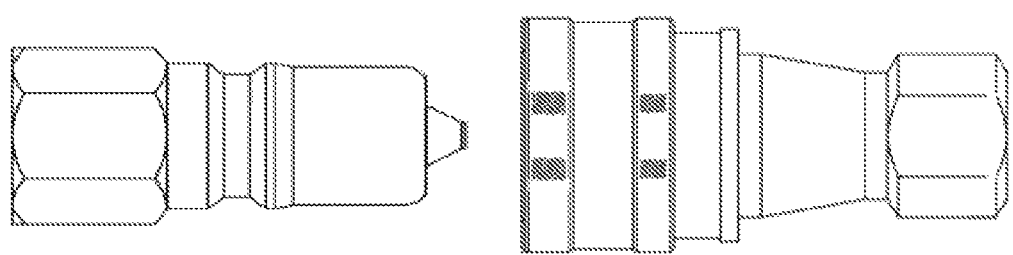
(a)     Fig. 8     (b)

OVERALL EFFICIENT HEAT DISSIPATION SYSTEM FOR HIGH POWER DENSITY CABINET

CROSS-REFERENCE TO RELATED APPLICATION

The present application is a national stage entry under 35 U.S.C. § 371 of International Application No. PCT/CN2020/099583, filed Jun. 30, 2020, which claims priority to Chinese Application No. 201910586668.1, filed Jul. 1, 2019, the entire contents of both of which are incorporated herein by reference.

TECHNICAL FIELD

The invention relates to a high-efficiency integral cooling system for high power density cabinets, belonging to technical field of electronic equipment cooling. The invention also relates to a pump-driven two-phase loop cooling system for high power density cabinets.

BACKGROUND TECHNOLOGY

With the rapid development of information technology, the power density of a single server cabinet has been significantly increased. The main heat-generating elements on motherboard of server are CPUs and GPUs, etc., which take up about 60%-70% of the total server input power, while other elements on the server motherboard and power unit account for 30%-40% of the total input power. Through the pump-driven two-phase loop cooling system for high-power chips, the heat dissipation from these chips of the high power units server motherboard has been well solved, while the problem of dissipating heat from other elements and units of the server still needs to be solved.

At present, a PUE (Power Usage Effectiveness) value is usually used as evaluation index when evaluating the energy efficiency of a data center. PUE is the ratio of total energy consumption of a data center to its energy consumption of IT load. Because other heat-generating elements on the motherboard are relatively scattered and the power of CPUs and GPUs is also small in the past years, air cooling technology is more suitable to solve the heat dissipation problem thereof. The conventional cooling method is to use air conditioning system for the computer room to cool the servers, but usually the room covers a large area, and the air conditioner is far from the heating elements of the servers, it is difficult for the cold air to accurately take away the heat generated by the sever. At the same time, the cold air from the air-conditioning system is partly mixed with the hot air from the servers in the room, the temperature difference between the cold air and the heating elements is reduced, and the heat transfer effect is thus reduced. In this case, the methods to increase the temperature difference by increasing cold air flowrate or reducing temperature of the cold air will significantly increase energy consumption of the refrigeration equipment for the computer room, resulting in a larger PUE value, which will greatly increase electricity cost of the computer room.

In addition, the conventional air cooling mode uses the forced convection of air to cool the server. Due to the high thermal resistance of the air cooling, a large temperature difference between the air and the server is needed to realize effective heat transfer. Therefore, refrigeration equipment for computer room air conditioning system is needed to produce cold air and maintain an effective temperature difference. When the power density of a single cabinet keeps increasing, the air cooling mode can deal with the cabinet heat dissipation problem by continually lowering the air temperature or increasing air flowrate to strengthen the convection, both of which will significantly increase the energy consumption of the cooling system.

Liquid cooling mode uses liquid forced convection to cool the server, and its heat dissipation capacity is much higher than that of the air cooling mode. However, the cooling mechanism of liquid sensible cooling is the same as that of air cooling mode, and its corresponding measures to the improvement of the cabinet power density are also the same. Moreover, the potential threat of liquid leakage to server also strictly restricts its application in the field of server heat dissipation.

Existing server cooling solutions combined with conventional heat pipes (mainly capillary tube) are generally as follows: The heat pipe heat exchanger is attached to the main power element (CPU, GPU, etc.) of the server. The internal working medium of the heat pipe absorbs heat and evaporates, transferring heat from evaporation section on the surface of the power element to condensation section of the heat pipe as heat sink. This mode has strong heat transfer ability and expansibility. But because the heat pipe has two contact thermal resistances at the evaporation section and the condensation section, which undoubtedly produces larger temperature difference when transfers high heat flux and increases the heat transfer cost.

SUMMARY

Aiming at the defects of the existing heat dissipation technologies, the present invention provides an overall efficient cooling system for the high power density cabinet. To be specific, a pump-driven two-phase loop subsystem for high-power chips cooling can cool the main heat-generating elements in the server such as CPUs and GPUs, while air cooling subsystem for the cabinet can cool the other heat-generating elements in the server except the main heat-generating units-CPUs and GPUs. The precise heat dissipation subsystem for chips of high power and the air cooling heat dissipation subsystem for low power components are combined. On the one hand, the system can help server cabinets completely remove the dependence on the room air conditioning system. On the other hand, it can increase the temperature of the circulating air in the cabinet. Thus, under the premise of more energy saving, the present invention effectively solves the problem of overall heat dissipation of high power density cabinets.

According to one aspect of the invention, an integral and efficient cooling system for high power density cabinets is provided, whose features include:

Refrigerant circulation loop, and air circulation loop.

The refrigerant circulation loop includes:

A pump-driven two-phase loop comprises a refrigerant liquid storage tank, a liquid pump, a first three-way valve, a throttling device, an air-cooling evaporator, a second three-way valve, a third three-way valve, a Y-type three-way valve, and a condenser.

A vapor compression loop comprises a refrigerant liquid storage tank, a liquid pump, a first three-way valve, a throttling device, an air-cooling evaporator, a second three-way valve, a compressor, a third three-way valve, a Y-type three-way valve, and a condenser.

The air circulation loop includes an air-cooling evaporator, a circulating air duct formed by a closed cabinet.

When using the pump-driven two-phase loop, the second three-way valve is used to close the channel between the air-cooling evaporator and the compressor; the third three-way valve is used to close the channel between the compressor and the Y-type three-way valve; besides, the channel between the air-cooling evaporator and the y-shaped three-way valve is open. Driven by the liquid pump, the liquid refrigerant from the storage tank enters the throttling device after the first three-way valve, then expands in the throttling device, its pressure and temperature both decrease. Then the low-pressure refrigerant enters the air-cooling evaporator along the pipeline, and absorbs the heat carried by hot air, through phase change in the air-cooling evaporator and then becomes gas-liquid two-phase. The gas-liquid two-phase refrigerant flows through the Y-type three-way valve, then enters the condenser and is condensed into liquid phase. Finally, the liquid refrigerant returns to the liquid storage tank. The refrigerant circulates in the above components in turn, making up the pump-drive two-phase loop in the cabinet air cooling system, and continuously dissipates heat through the circulation.

When using the vapor compression loop, the second and the third three-way valves are used to close the channel between the air-cooling evaporator and the y-shaped three-way valve; besides, the channel between the air-cooling evaporator and the compressor, and the channel between the compressor and the Y-type three-way valve are both open. Driven by the liquid pump, the liquid refrigerant in the storage tank enters the throttling device through the first three-way valve, then expands in the throttling device, its pressure and temperature both decrease. The low-pressure refrigerant enters the air-cooling evaporator along the pipeline, and absorbs the heat carried by the hot air, through phase change in the air-cooling evaporator, then becomes gas-liquid two-phase. Through the gas-liquid separator, the gas phase refrigerant is compressed by the compressor. The compressed vapor refrigerant flows through the Y-type three-way valve, then enters the condenser and is condensed into the liquid phase. Finally, the liquid refrigerant returns to the liquid storage tank. In this way, the refrigerant continuously dissipates heat through the vapor compression loop of the cabinet air cooling system.

Aiming at the defects of existing cabinet cooling technologies, the present invention provides a kind of pump-driven two-phase loop heat dissipation system used in a high power density server cabinet. This system can dissipate heat generated by main power elements of a server, effectively solve the problem of local hot-spots. Moreover, by using micro/mini-channel flow boiling heat transfer technology, the power density of a single cabinet can be significantly increased, and the noise of the cabinet can be significantly reduced.

According to one aspect of the invention, a pump-driven two-phase loop cooling system for a high-power density cabinet is provided, whose features include:

A liquid refrigerant storage tank, a pump, a filter, distribution pipes, server evaporation heat sinks, collecting pipes and a heat exchanger are successively connected, wherein the heat exchanger and the refrigerant storage tank are connected to form a circulating loop.

The distribution pipe mentioned before includes: an inlet located at the bottom of the pipe, a plurality of first distribution ports arranged in layers from bottom to top, and one second distribution port located on top of the pipe. The inlet of the distribution pipe is connected with the filter outlet in the pipeline; those first distribution ports are connected with the inlet of corresponding server's evaporation heat sinks by self-locking joint.

The collecting pipe mentioned before includes: a main outlet located at the bottom of the pipe, a plurality of first collecting ports arranged in layers from bottom to top, one second collecting port at the next highest position and one auxiliary outlet, which is located at apex of the collecting pipe. The main and the auxiliary outlets are both in connection with the inlet of the heat exchanger through the pipeline; those first collecting ports are connected with the outlet of corresponding server's high power evaporation heat sinks by self-locking joint.

The second distribution port is connected with the second collecting port through a one-way valve.

Each front end of the liquid inlet of the high power unit of the server is provided with a local flow resistance component after the self-locking joint, so that the distribution pipe as a whole forms local flow resistance that gradually decreases from bottom to top.

A further aspect of the invention provides an overall efficient cooling method for a high power density cabinet, whose characterizations include:

When using the pump-driven two-phase loop, the second three-way valve is used to close the channel between the air-cooling evaporator and the compressor; the third three-way valve is used to close the channel between the compressor and the Y-type three-way valve; besides, the channel between the air-cooling evaporator and the y-shaped three-way valve is open. Driven by the liquid pump, the liquid refrigerant from the storage tank enters and expands in the throttling device after the first three-way valve, its pressure and temperature both decrease. The low-pressure refrigerant enters the air-cooling evaporator along the pipeline, and absorbs the heat carried by the hot air through phase change in the air-cooling evaporator, then becomes gas-liquid two-phase. The gas-liquid two-phase refrigerant flows through the Y-type three-way valve, then enters the condenser and is condensed into pure liquid phase. Finally, the liquid refrigerant returns to the liquid storage tank. The refrigerant circulates in the above components in turn, making up the pump-drive two-phase loop in the cabinet for air cooling system, and continuously dissipates heat through the circulation.

When using the vapor compression loop, the second and the third three-way valves are used to close the channel between the air-cooling evaporator and the y-shaped three-way valve; besides, the channel between the air-cooling evaporator and the compressor, and the channel between the compressor and the Y-type three-way valve are both open. Driven by the liquid pump, the liquid refrigerant from the storage tank enters the throttling device after the first three-way valve, then expands in the throttling device, its pressure and temperature both decrease. The low-pressure pressure refrigerant enters the air-cooling evaporator along the pipeline, and absorbs the heat carried by the hot air through phase change in the air-cooling evaporator, then becomes gas-liquid two-phase. Through the gas-liquid separation process, the refrigerant becomes into the gas phase, then is compressed by compressor. The compressed vapor refrigerant flows through the Y-type three-way valve, then enters the condenser and is condensed into the liquid phase. Finally, the liquid refrigerant returns to the liquid storage tank. In this way, the refrigerant continuously dissipates heat through the vapor compression loop of the cabinet for air cooling system.

The beneficial effects of this invention include:

1) The pump-drive two-phase loop high-power chip cooling system dissipates heat of the high power units (such as CPU and GPU chips) in the server, effectively solving the local hot-spots problems in the cabinet.

2) Through the cabinet air cooling system based on the pump-drive two-phase loop, other low power elements can also be cooled by air except high-power chips like CPUs and GPUs.

3) Combining the pump-driven two-phase loop for cooling high-power chips with cabinet air cooling system, different cooling methods can be adopted to cool the high power units and other low power elements inside the cabinet. On the one hand, it can help the server cabinets thoroughly to get rid of their dependence on room air conditioning cooling. On the other hand, it can increase temperature of the circulating air in the cabinet. Under the premise of more energy saving, the system effectively solves the problems of overall heat dissipation of the high power density cabinet. Also, it is advantageous to the construction of edge data center.

4) According to outdoor ambient temperature, opening and closing strategies of the three-way valves are used to select the refrigerant circulation loop for the cabinet air cooling system, so as to achieve the maximum energy saving value of the system on the basis of meeting the heat dissipation requirements.

5) The main components of the cooling system are installed in a drawer type square compartment, and the square compartment is connected with the outside pipelines by self-locking joints, so as to facilitate installation, maintenance and disassembly.

6) The closed cabinet can effectively shield the influence of the external environment on the electronic equipment and reduce the failure rate of the internal components of the cabinet.

7) The complete isolation of single cabinet from computer room or data center can reduce the environmental requirements of the data center, broaden the selection range of data center site, and then reduce operation and maintenance cost of the computer room or data center.

8) By using inside space of a cabinet as air duct, the air circulation distance is reduced, and the problem of mixing of hot and cold air is minimized, so as to improve the heat exchange efficiency and reduce the energy consumption required for room air conditioning.

9) The refrigerant itself is the insulating medium, which will instantly gasify even if it leaks, and will not cause any harm to servers inside the cabinet. Moreover, the refrigerant belongs to the low pressure refrigerant under the normal temperature, and its boiling point at 1 atm is higher than room temperature (for example 25° C.). The system can operate at a low positive pressure state, and its components do not need additional high pressure requirements.

The beneficial effects of the pump-driven two-phase loop cooling system for a high power density cabinet include:

The heat generated by high power units (such as CPU and GPU chips) in the server is dissipated through the pump-driven or compressor-driven two phase loops of cooling for the server, which effectively solves the local hot-spot problem of the cabinet.

The use of layered arrangement of servers improves the utilization of spaces of a cabinet, so that the cabinet can be loaded with more servers, greatly saving the cabinet floor area.

The main components of the cooling distribution unit (CDU) are installed in a drawer type square compartment, and the square compartment is connected with the outside pipelines through the form of self-locking joints, so as to facilitate installation, maintenance and disassembly.

In the two phase flow cooling system of the server, vapor quality change of refrigerant in micro/mini-channel heat sink can adapt to larger power fluctuations of server high power chips, sharply reduces the complexity of flowrate control of the cooling system. At the same time, boiling convection of refrigerant has bigger heat capacity than air cooling and single phase liquid-cooling, thus it can effectively solve the severe cooling problems of high power density cabinets.

When any of the servers fails or needs to be replaced, the self-locking joints can be disconnected to repair and replace the server, and the rest of the server cooling system does not need to stop.

The refrigerant itself is insulated medium, which will instantly gasify even if it leaks, and will not cause harm to the servers. Moreover, the refrigerant belongs to low pressure refrigerant under the normal temperature, and its boiling point at 1 atm is higher than room temperature (for example 25° C.). The system can operate at a low positive pressure state, and its components do not need additional high pressure requirements.

From the high power units of the server to the external cooling cycle, there exist only two heat resistances, which are thermal contact resistance and overall thermal resistance of the two phase loop heat pipe respectively, so the total heat dissipation resistances are reduced and the heat transfer temperature difference needed is effectively reduced.

The low power consumption of the pump can significantly reduce the energy consumption of the cooling system.

BRIEF DESCRIPTION OF THE DRAWINGS

FIG. 8(a)-(b) are structural schematic diagrams of a pair of self-locking joints according to an embodiment of the invention, wherein FIG. 8(a) is a structural schematic diagram of the self-locking male head and FIG. 8(b) is a structural schematic diagram of the self-locking female head.

DETAILED DESCRIPTION OF THE EMBODIMENTS

As shown in FIG. 1 to FIG. 4, the overall high-efficiency cooling system for a high power density cabinet is improved on the basis of a pump-driven two-phase loop for high-power chips cooling system, and its overall structure includes the pump-driven two-phase loop for high-power chips cooling system and the cabinet air cooling system.

Figure 1:
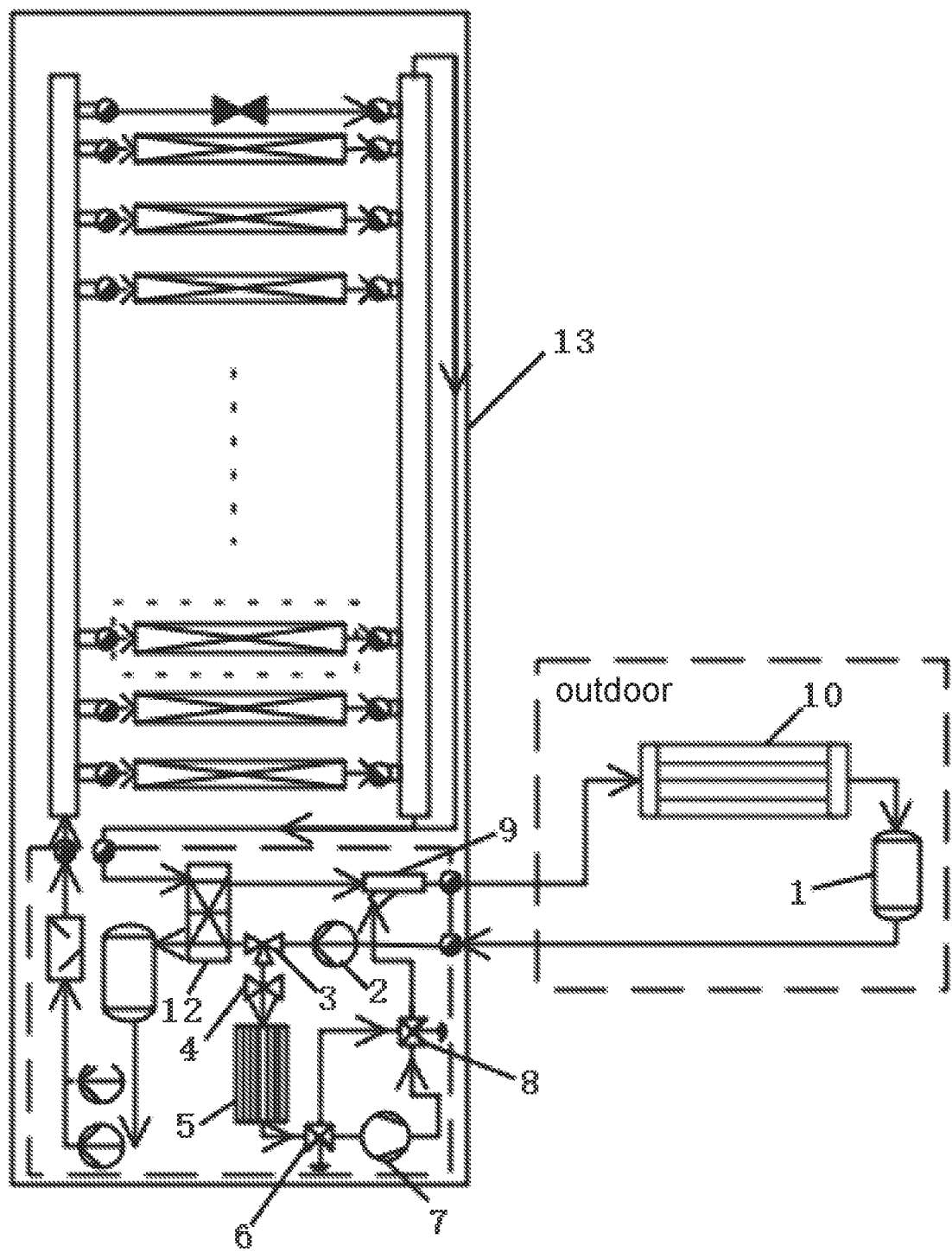
FIG. 1 is a schematic diagram of the overall structure of an integral efficient cooling system for a high power density cabinet according to an embodiment of the invention.
Figure 2:
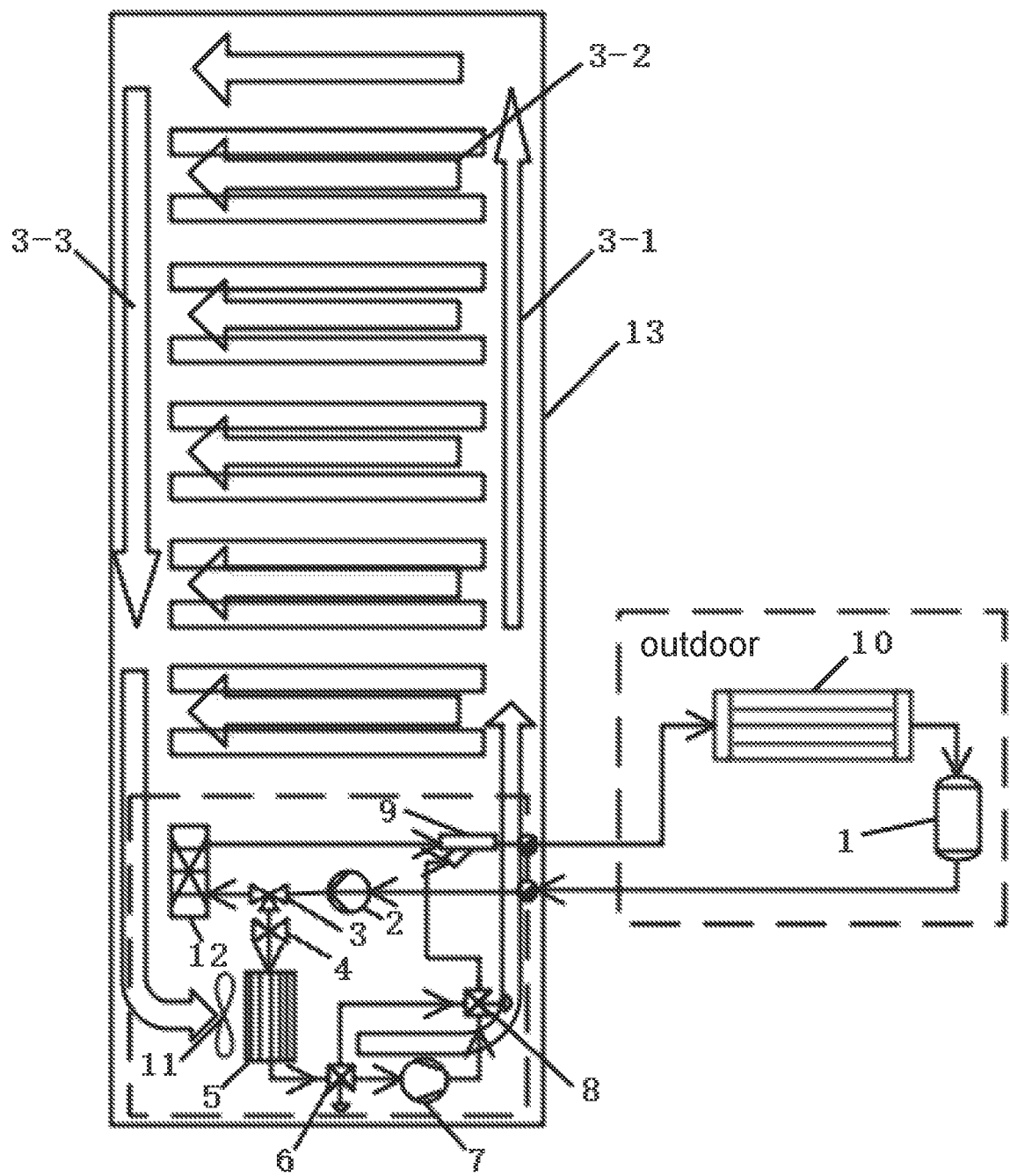
FIG. 2 is a schematic side view of the local structure of the cabinet air cooling system of an overall efficient cooling system for a high power density cabinet according to the first embodiment of the invention.
Figure 3:
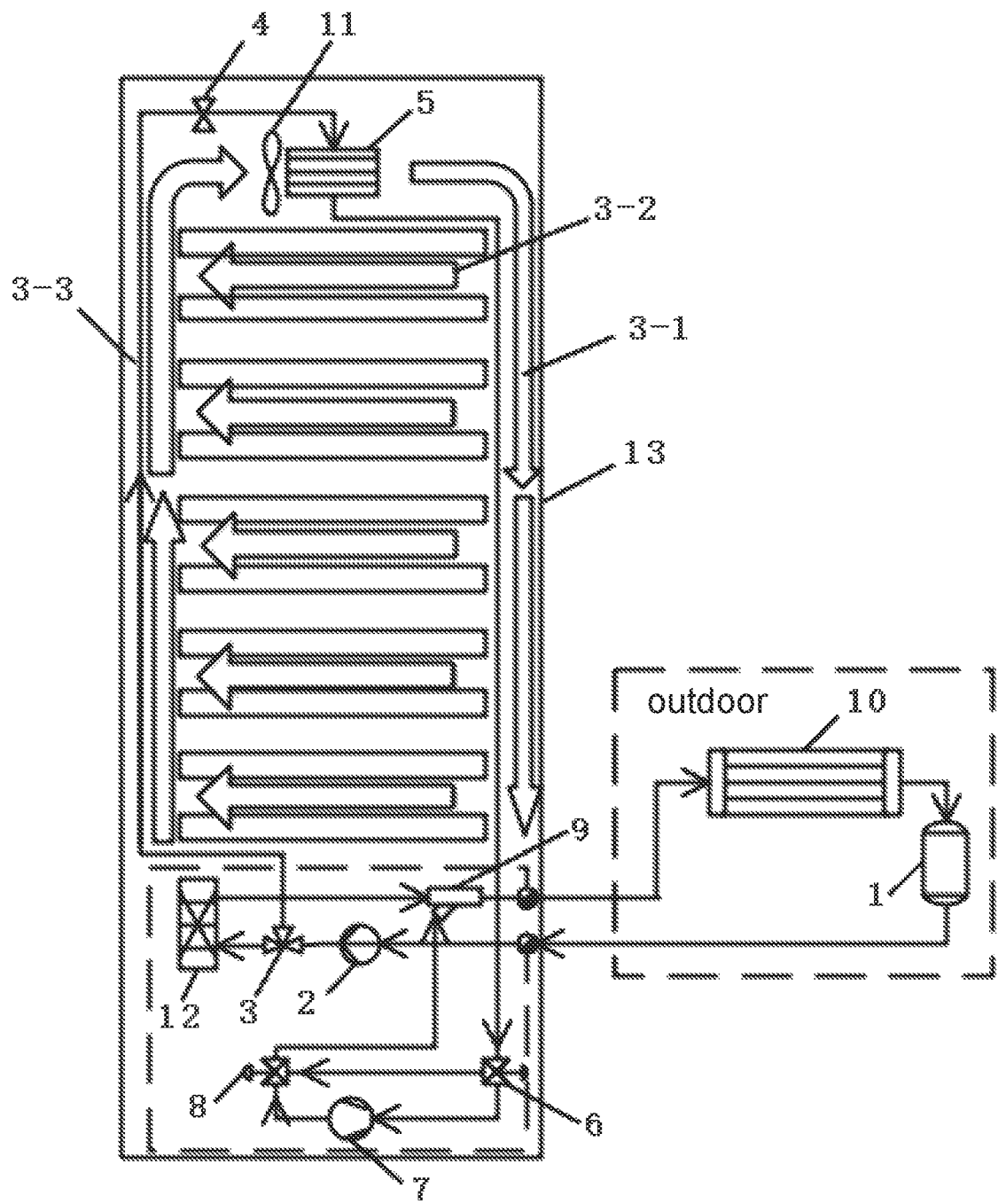
FIG. 3 is a schematic side view of the local structure of the cabinet air cooling system of an overall efficient cooling system for a high power density cabinet of the second embodiment of the invention.

As shown in FIG. 1, FIG. 2 and FIG. 3, the cabinet air cooling system described comprises a refrigerant circulation loop and an air circulation loop. In order to cope with different circulation conditions, the refrigerant circulation loop is divided into two ways:

One way is the pump-driven two-phase loop, including refrigerant liquid storage tank 1, liquid pump 2, the first three-way valve 3, throttling device 4, air-cooling evaporator 5, the second three-way valve 6, the third three-way valve 8, Y-type three-way 9, and condenser 10.

The other way is the vapor compression loop, including refrigerant liquid storage tank 1, liquid pump 2, the first three-way valve 3, throttle device 4, air-cooling evaporator 5, the second three-way valve 6, vapor compressor 7, the third three-way valve 8, Y-type three-way 9, and condenser 10.

The air circulation loop in the cabinet includes fan 11 and air-cooling evaporator 5. The enclosed cabinet forms an air circulation duct 13.

In the first example of implementation shown in FIG. 1 and FIG. 2, the position of refrigerant liquid storage tank 1 is lower than that of condenser 10 along the direction of gravity, and the position of liquid pump 2 is lower than that of refrigerant liquid storage tank 1 along the direction of gravity.

The invention is further described below in conjunction with the specific heat dissipation process of the cooling system.

In the first example of implementation shown in FIG. 1 and FIG. 2, the refrigerant is R-141b whose boiling point under atmospheric pressure is 32° C. The heat exchanger 12 is a plate heat exchanger. The cabinet used is a standard 42U cabinet, containing 30 1U servers, which are arranged continuously from top to bottom. There are two CPU chips inside each server that need to be cooled. The specific process includes:

In the pump-driven two-phase loop high-power chip cooling system, the liquid-phase R-141b cools the high power element CPU in the cabinet through phase change in the micro/mini-channel heat sink.

In the refrigerant circulation loop for the cabinet air cooling system:

When using the pump-driven two-phase loop, the second three-way valve 6 is used to close the channel between the air-cooling evaporator 5 and the compressor 7; the third three-way valve 8 is used to close the channel between the compressor 7 and the Y-type three-way valve 9; besides, the channel between the air-cooling evaporator 5 and the Y-type three-way valve 9 is open. Driven by the liquid pump 2, the liquid refrigerant from the storage tank 1 enters throttling device 4 through the first three-way valve 3, then expands in the throttling device 4, its pressure and temperature both decrease. The low-pressure refrigerant enters the air-cooling evaporator 5 along the pipeline, and absorbs the heat carried by the hot air through phase change in the air-cooling evaporator 5, then becomes gas-liquid two-phase. The gas-liquid two-phase refrigerant flows through the Y-type three-way valve 9, then enters the condenser 10 and is condensed into the liquid phase. Finally, the liquid refrigerant returns to the liquid storage tank 1. The refrigerant circulates in the above components in turn, making up the pump-driven two-phase loop in the cabinet air cooling system, and continuously dissipates heat through the circulation.

When using the vapor compression loop, the second three-way valve 6 and the third three-way valve 8 are used to close the channel between the air-cooling evaporator 5 and the Y-type three-way valve 9; besides, the channel between the air-cooling evaporator 5 and the compressor 7, and the channel between the compressor 7 and the Y-type three-way valve 9 are both open. Driven by the liquid pump 2, the liquid refrigerant in the storage tank 1 enters the throttling device 4 through the first three-way valve 3, then expands in the throttling device 4, its pressure and temperature both decrease. The low-pressure refrigerant enters the air-cooling evaporator 5 along the pipeline, and absorbs the heat carried by hot air through phase change in the air-cooling evaporator 5, then becomes gas-liquid two-phase. Through the gas-liquid separation process, the refrigerant becomes into gas phase, then is compressed by compressor 7. The compressed vapor refrigerant flows through the Y-type three-way valve 9, then enters the condenser 10 and is condensed into liquid phase. Finally, the liquid refrigerant returns to the liquid storage tank 1. In this way, the refrigerant continuously dissipates heat through the vapor compression loop of the cabinet for air cooling system.

As shown in FIG. 2, in the air circulation loop for the cabinet air cooling system, hot air 3-3 driven by fan 11 flows into air-cooling evaporator 5, the heat carried by hot air 3-3 is absorbed by refrigerant evaporation in evaporator 5, then the hot air 3-3 becomes cold air 3-1. The cold air 3-1 flows to each layer of the servers and the motherboards 3-2 through the guidance of the closed cabinet 13. Compared to hot air, the density of cold air is higher, and in the process of upward flow, cold air can play a role of uniforming horizontal flow in each layer. In the process of flowing through each layer of server's motherboard 3-2, the cold air 3-1 absorbs the heat from the small power elements of the server and becomes hot air 3-3. Then the hot air 3-3 flows to fan 11 through the guidance of the closed cabinet 13. This creates a loop of continuous heat dissipation.

In the second example of implementation shown in FIG. 3, the air-cooling evaporator 5 and fan 11 are located at the top of the cabinet.

In a specific example of the second implementation, the refrigerant is R-141b whose boiling point under atmospheric pressure is 32° C. The heat exchanger 12 is a plate heat exchanger. The cabinet used is a standard 42U cabinet, containing 30 1U servers, which are arranged continuously from top to bottom. There are two high power CPU chips inside each server that need to be cooled. The specific process includes:

In the pump-driven two-phase loop high-power chips cooling system, the refrigerant R-141b cools the high power element CPU in the cabinet through evaporation in the micro/mini-channel heat sink.

In the refrigerant circulation loop included in the cabinet air cooling system:

When using the pump-driven two-phase loop, the second three-way valve 6 is used to close the channel between the air-cooling evaporator 5 and the compressor 7; the third three-way valve 8 is used to close the channel between the compressor 7 and the Y-type three-way valve 9; besides, the channel between the air-cooling evaporator 5 and the Y-type three-way valve 9 is open. Driven by the liquid pump 2, the liquid refrigerant from the storage tank 1 enters the throttling device 4 through the first three-way valve 3, then expands in the throttling device 4, its pressure and temperature both decrease. The low-pressure refrigerant enters the air-cooling evaporator 5 along the pipeline, and absorbs the heat carried by the hot air through phase change in the air-cooling evaporator 5, then becomes gas-liquid two-phase. The gas-liquid two-phase refrigerant flows through the Y-type three-way valve 9, then enters the condenser 10 and is condensed into the liquid phase. Finally, the liquid refrigerant returns to the liquid storage tank 1. The refrigerant circulates in the above components in turn, making up the pump-driven two-phase loop in the cabinet air cooling system, and continuously dissipates heat through the circulation.

When using the vapor compression loop, the second three-way valve 6 and the third three-way valve 8 are used to close the channel between the air-cooling evaporator 5 and the Y-type three-way valve 9; besides, the channel between the air-cooling evaporator 5 and the compressor 7, and the channel between the compressor 7 and the Y-type three-way valve 9 are both open. Driven by the liquid pump 2, the liquid refrigerant in the storage tank 1 enters the throttling device 4 through the first three-way valve 3, then expands in the throttling device 4, its pressure and temperature both decrease. The low-pressure refrigerant enters the air-cooling evaporator 5 along the pipeline, and absorbs the heat carried by the hot air through phase change in the air-cooling evaporator 5, then becomes gas-liquid two-phase. Through the gas-liquid separation process, the refrigerant becomes into the gas phase, then is compressed by compressor 7. The compressed vapor refrigerant flows through the Y-type three-way valve 9, then enters the condenser 10 and is condensed into the liquid phase. Finally, the liquid refrigerant returns to the liquid storage tank 1. In this way, the refrigerant continuously dissipates heat through the vapor compression loop of the cabinet air cooling system.

As shown in FIG. 3, in the air circulation loop for the cabinet air cooling system, hot air 3-3 driven by fan 11 flows into air-cooling evaporator 5, the heat carried by hot air 3-3 is absorbed by refrigerant evaporation in evaporator 5, then the hot air 3-3 becomes cold air 3-1. The cold air 3-1 flows to each layer of the servers and motherboards 3-2 through the guidance of the closed cabinet 13. Compared to hot air, the density of cold air is higher, and in the process of upward flow, cold air can play a role of uniforming horizontal flow in each layer. In the process of flowing through each layer of server motherboard 3-2, the cold air 3-1 absorbs the heat from the small power elements of the server and becomes hot air 3-3. Then the hot air 3-3 flows to fan 11 through the guidance of the closed cabinet 13. This creates a loop of continuous heat dissipation.

Figure 4:
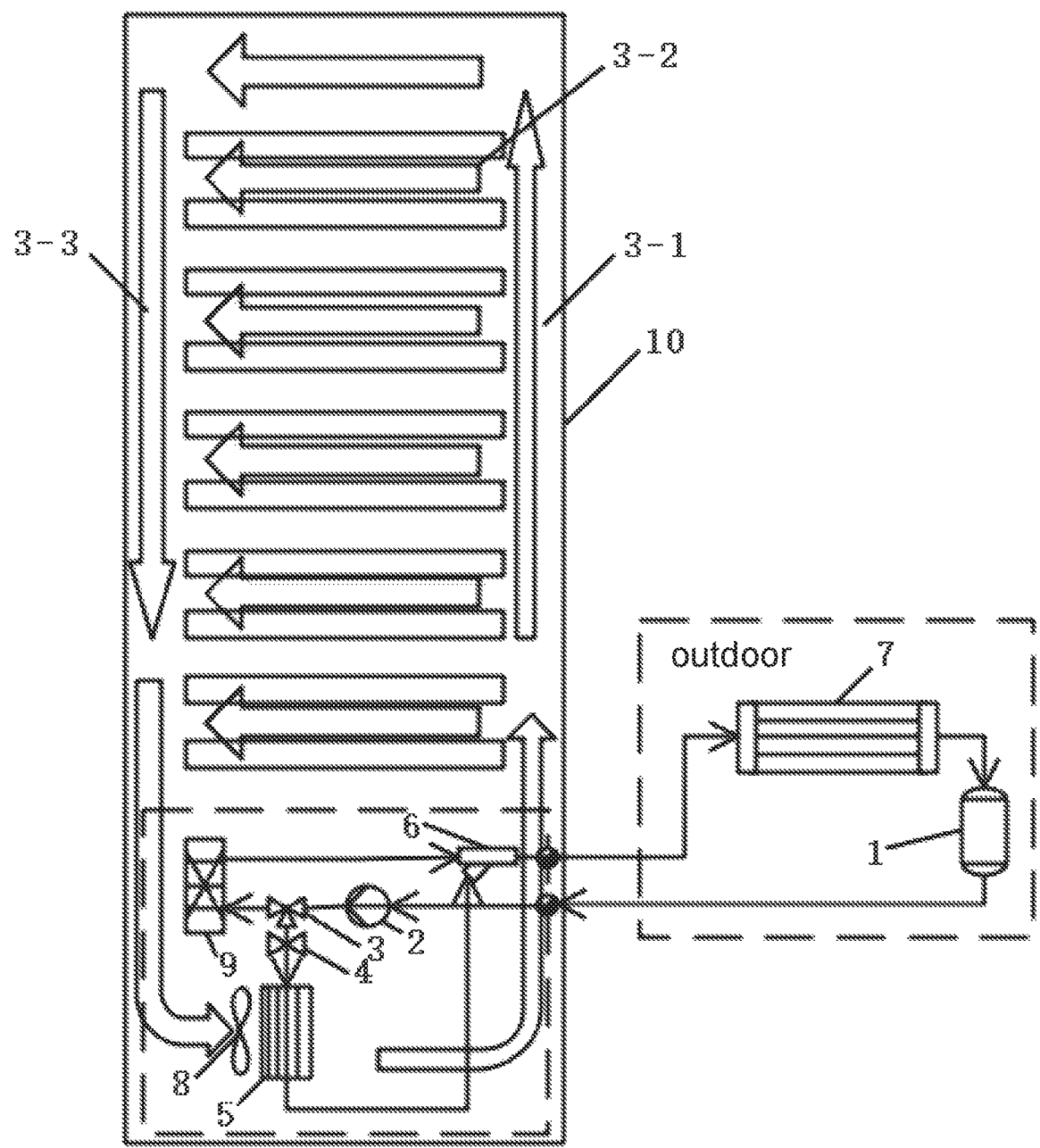
FIG. 4 is a schematic side view of the local structure of the cabinet air cooling system of an overall efficient cooling system for a high power density cabinet of the third embodiment of the invention.

In the third example of implementation shown in FIG. 4, only the pump-driven two-phase loop is retained in the refrigerant circulation loop and the vapor compression loop is removed. As shown in FIG. 4, the refrigerant circulation loop includes refrigerant liquid storage tank 1, liquid pump 2, three-way valve 3, throttling device 4, air-cooling evaporator 5, Y-type three-way valve 6, and condenser 7. The air circulation loop includes an air duct composed of fan 8, air-cooled condenser 5 and closed cabinet 10.

In the third example of implementation shown in FIG. 4, the refrigerant is R-141*b* whose boiling point under atmospheric pressure is 32° C. The heat exchanger 12 is a plate heat exchanger. The cabinet used is a standard 42U cabinet, containing 30 1U servers, which are arranged continuously from top to bottom. There are two high power CPU chips inside each server that need to be cooled. The specific process includes:

In the pump-driven two-phase loop high-power chips cooling system, the refrigerant R-141*b* cools the high power element CPU in the cabinet through evaporation in the micro/mini-channel heat sink.

In the refrigerant circulation loop included in the cabinet air cooling system, driven by the liquid pump 2, the liquid refrigerant from the storage tank 1 enters the throttling device 4 through the first three-way valve 3, then expands in the throttling device 4, its pressure and temperature both decrease. The low-pressure refrigerant enters the air-cooling evaporator 5 along the pipeline, and absorbs the heat carried by the hot air through phase change in the air-cooling evaporator 5, then becomes gas-liquid two-phase. The gas-liquid two-phase refrigerant flows through the Y-type three-way valve 6, then enters the condenser 7 and is condensed into the liquid phase. Finally, the liquid refrigerant returns to the liquid storage tank 1. The refrigerant circulates in the above components in turn, making up the pump-driven two-phase loop in the cabinet air cooling system, and continuously dissipates heat through the circulation.

As shown in FIG. 4, in the air circulation loop for the cabinet air cooling system, hot air 3-3 driven by fan 8 flows into air-cooling evaporator 5, the heat carried by hot air 3-3 is absorbed by refrigerant evaporation in evaporator 5, then the hot air 3-3 becomes cold air 3-1. The cold air 3-1 flows to each layer of the servers and motherboards 3-2 through the guidance of the closed cabinet 10. Compared to hot air, the density of cold air is higher, and in the process of upward flow, cold air can play a role of uniforming horizontal flow in each layer. In the process of flowing through each layer of server motherboard 3-2, the cold air 3-1 absorbs the heat from the small power elements and becomes hot air 3-3. Then the hot air 3-3 flows to fan 8 through the guidance of the closed cabinet 10. This creates a loop of continuous heat dissipation.

Figure 5:
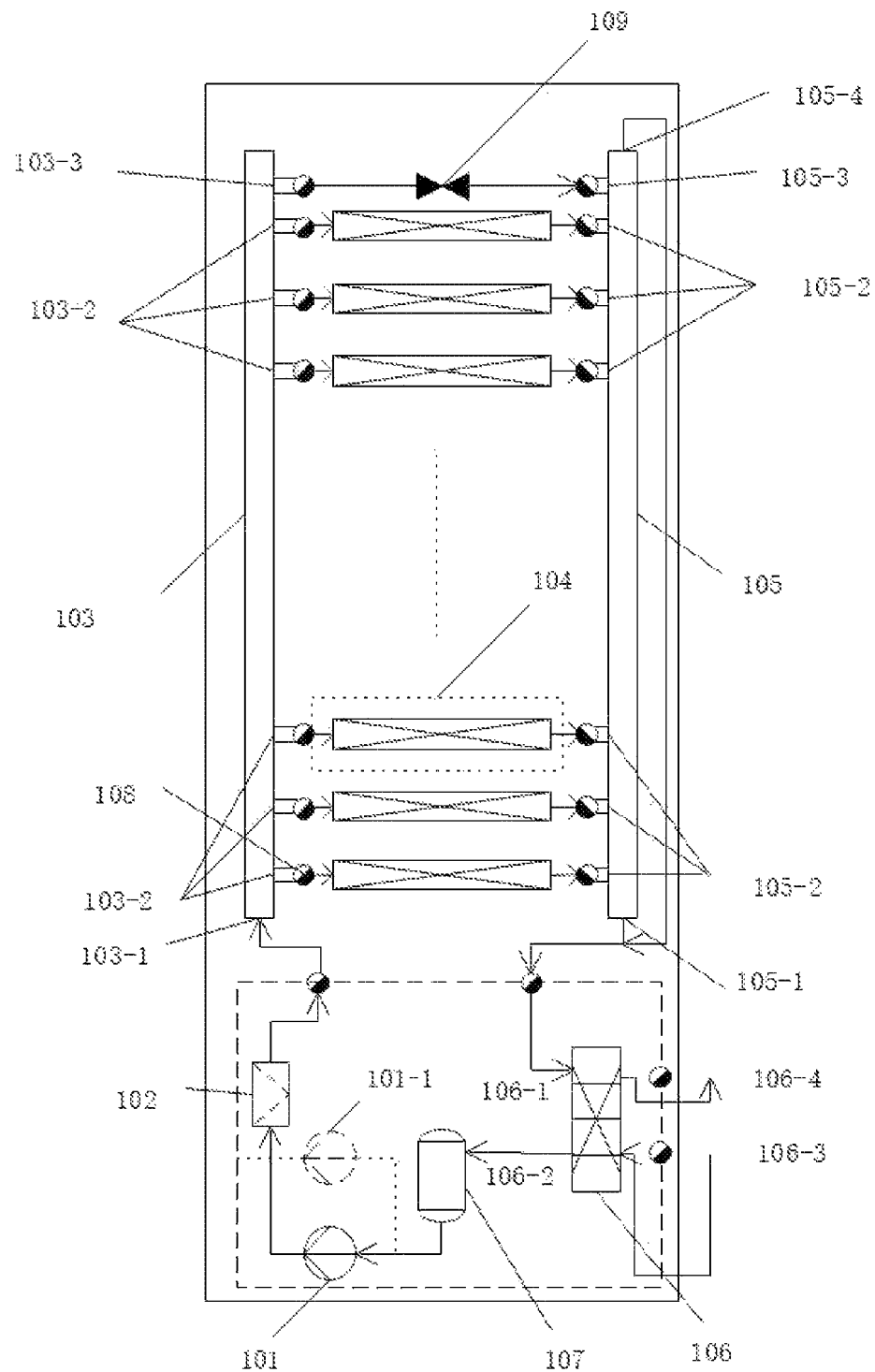
FIG. 5 is a structural schematic diagram of the pump-driven two-phase loop cooling system for a high power density cabinet according to an embodiment of the invention.

As shown in FIG. 5, in the present invention, the pump-driven two-phase loop cooling system for the high power density cabinet comprises a refrigerant liquid storage tank 107, a pump 101, a distribution pipe 103, dozens of heat dissipation units 104 in servers, a collecting pipe 105 and a heat exchanger 106, which is connected to the refrigerant liquid storage tank 107 to form a circulating loop. The pump 101, the filter 102, the heat exchanger 106 and the refrigerant liquid storage tank 107 are fixed in the drawer type square compartment at the bottom of the cabinet. The pipeline connections between the square compartment and the outside are completed through two pairs of self-locking joints 108 for easy installation, maintenance and disassembly.

In this example of implementation, it also includes a redundant pump 101-1 arranged in parallel with the pump 101, which can work in place of the pump 101 once a failure of the pump 101 occurs to ensure normal operation of the cooling system. In particular, the pump 101 and the redundant pump 101-1 are positioned lower than the refrigerant storage tank 107 in the direction of gravity, while the refrigerant storage tank 107 is positioned lower than the heat exchanger 106 in the direction of gravity.

The distribution pipe 103 includes: an inlet 103-1 located at the bottom of the pipe, a plurality of first distribution ports 103-2 arranged in layers from bottom to top, and one second distribution port 103-3 located on top of the pipe. The inlet of the distribution pipe 103-1 is connected with the filter 102 outlet in the pipeline; those first distribution ports 103-2 are connected with the inlet of corresponding servers' heat dissipation units 104 by the self-locking joints 108.

Figure 6:
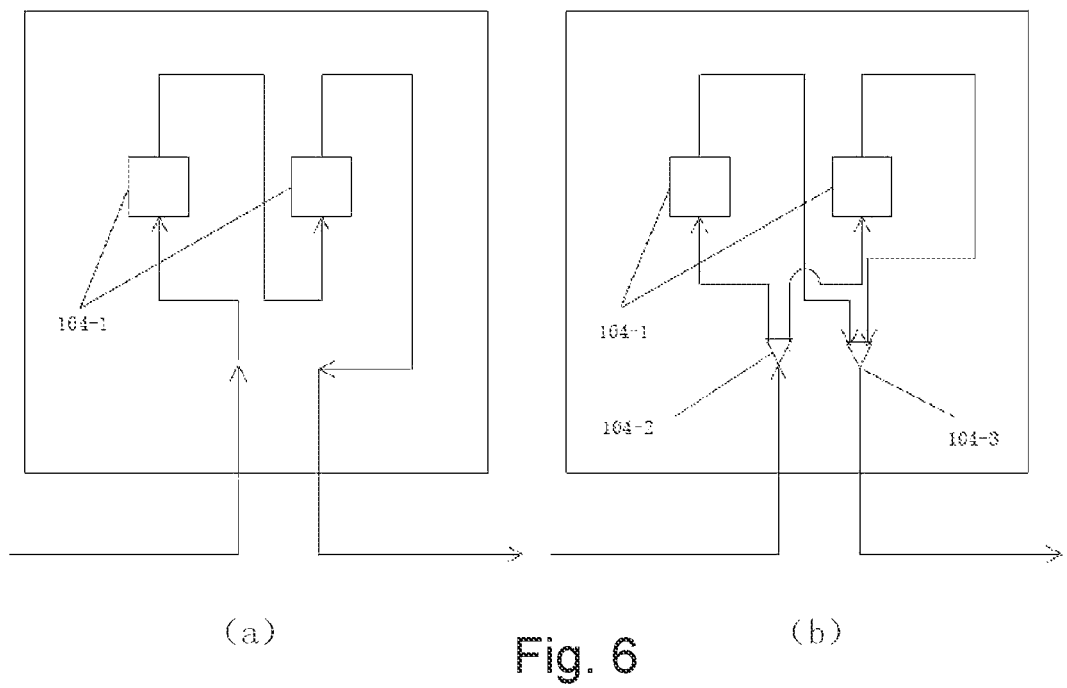
FIG. 6(a) shows a schematic diagram of a tandem structure of the server cooling unit for high power chips according to an embodiment of the invention.
FIG. 6(b) shows a schematic diagram of a parallel structure of the server cooling unit for high power chips according to an embodiment of the invention.

Each server's heat dissipation unit 104 includes one or more micro/mini-channel heat sinks. In the example, each server's heat dissipation units 104 consists of two micro/mini-channel heat sinks 104-1 in tandem (as shown in FIG. 6(*a*)) or in parallel (as shown in FIG. 6(*b*)). In the case of micro/mini-channel heat sinks connected in parallel with each other, the server's heat dissipation units 104 also includes flow distribution module 104-2 and flow collection module 104-3. The liquid refrigerant from the distribution pipe 103 enters micro/mini-channel heat sinks 104-1 through the fluid distribution module 104-2, where it absorbs heat generated by the server's high power units-CPUs or GPUs and refrigerant boiling occurs. The refrigerant changes from liquid phase to gas-liquid two phase and then enters the flow collection module 104-3 and then the collecting pipe 105. In some examples of implementation, the micro/mini-channel heat sink 104-1 is stuck and clamped to the server's high power elements (e.g., CPU, GPU chips) with a highly efficient thermal conductive material between the heat sink 104-1 and surfaces of the CPUs or GPUs.

In particular, after the liquid refrigerant enters the distribution pipe 103, it is necessary to overcome the obvious influence of gravity on horizontal branching flow distribution. Therefore, a local flow resistance component is installed in front of the inlet of the server's high power unit 105 on each layer. At the same time, it is possible to connect the micro/mini-channel heat sinks 104-1 in tandem, parallel or a combination of both (parallel resistance is small, tandem resistance is large) to regulate the overall flow resistance of each layer and achieve the purpose of uniform refrigerant flow distribution for each layer of server. In particular, the local flow resistance component can be a pipe with small diameter.

According to an example of implementation of the invention, each flow resistance component comprises a section of tube and a cylinder disposed in the tube whose outer diameter is less than the inner diameter of the tube.

The collecting pipe 105 includes: the main outlet 105-1 located at bottom of the pipe, a plurality of first collecting ports 105-2 arranged in layers from bottom to top, one second collecting port 105-3 at the next highest position of the pipe and one auxiliary outlet 105-4, which is at the apex of the collecting pipe. The main outlet 105-1 and the auxiliary outlet 105-4 are both in connection with the inlet of the heat exchanger 106-1 through the pipeline; those first collecting ports 105-2 are connected with the outlet of corresponding servers' heat dissipation units 104 by self-locking joints.

Through the auxiliary outlet 105-4 of the collecting pipe 105, the vapor phase refrigerant that gathers at the top of the collecting pipe 105 due to buoyancy can be discharged in time. The pressure at the top of the collecting pipe 105 is reduced, and the internal pressure of the pipe is balanced. The outlet of each layer of the server's heat dissipation unit 104 can establish a similar outlet pressure, which facilitates the uniform distribution of refrigerant in each layer of the server's heat dissipation unit 104.

In particular, as shown in FIG. 5, the second distribution port 103-2 is directly connected to the second collecting port 105-2 through a one-way valve 109. The one-way valve 109 is used to adjust the pressure between the distribution pipe 103 and the collecting pipe 105. When too much vapor refrigerant gathers at the top of the distribution pipe 103, open the one-way valve 109, then the vapor refrigerant will directly flow into the collecting pipe 105, which can ensure the liquid refrigerant to enter all the servers' heat dissipation unit 104 at every layer smoothly.

Figure 7:
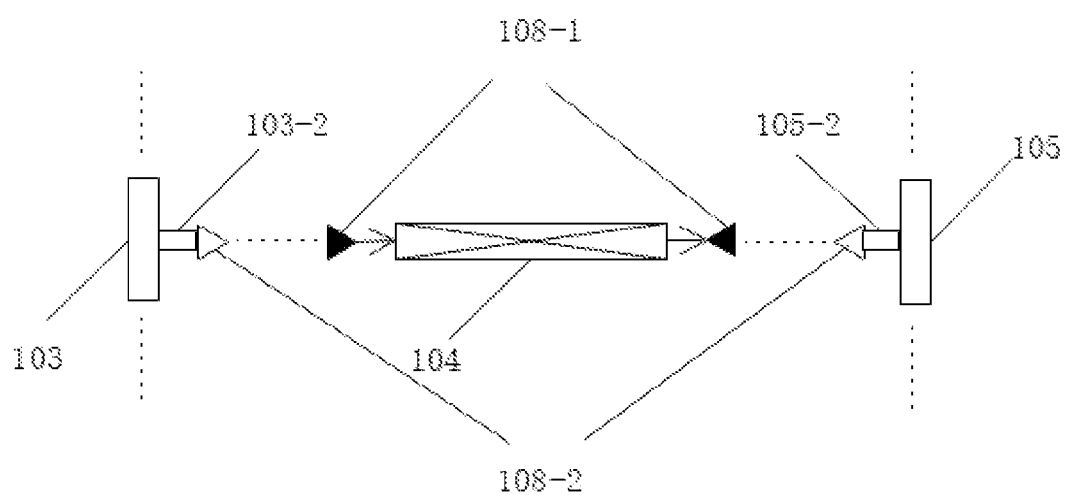
FIG. 7 is a connection schematic diagram of the server cooling unit, the distribution pipe and the collecting pipe according to an embodiment of the invention.

As shown in FIG. 7 and FIG. 8, a pair of the self-locking joints 108 includes a self-locking female head 108-1 and a self-locking male head 108-2. The self-locking male heads 108-2 are mounted on the distribution pipe 103 and the collecting pipe 105, respectively. The self-locking female heads 108-1 are mounted on the inlet and outlet ends of server heat dissipation unit 104. When the self-locking female head 108-1 and the self-locking male head 108-2 are engaged, the joint is opened and connected internally; when the self-locking female head 108-1 and the self-locking male head 108-2 are disconnected, each of them is self-locking, ensuring that system subcomponents are isolated from the environment.

In this example of implementation, the refrigerant is R-141*b* whose boiling point under atmospheric pressure is 32° C. The heat exchanger 6 is a plate heat exchanger. The cabinet used is a standard 42U cabinet, containing 30 1U servers, which are arranged continuously from top to bottom. There are two CPU chips inside each server that need to be cooled. The specific process includes:

Driven by pump 1, the liquid phase R-141*b* enters the distribution pipe 103 through the filter 102 and the inlet 103-1. A flow resistance component is provided between each first distribution port 103-2 and each server's heat dissipation unit 104, forming different local resistance to ensure uniform distribution of liquid phase R-141*b* to each layer of server's heat dissipation unit 104 from bottom layer to top layer of the cabinet.

After a period of operation, the gas phase R-141*b* might gather at the top of the distribution pipe 103, at which point the one-way valve 109 is opened for regulation. Then the gas phase R-141*b* will flow directly out of the second distribution port 103-3 and enters the collecting pipe 105 through the second collecting port 106-3, thus not affecting the liquid phase R-141*b* entering the server's heat dissipation units 104 near the top.

The liquid phase R-141*b* is evenly distributed to each of the micro/mini-channel heat sink 104-1 through the flow distribution module 104-2. The micro/mini-channel heat sink 104-1 is mounted on top of the CPU chip. When the chip is working, the liquid phase R-141*b* in the micro/mini-channel heat sink 104-1 absorbs the heat generated by the chip, evaporates and transforms into gas-liquid phase. Then the two-phase R-141*b* flows through the flow collection module 104-3, and enters the collecting pipe 105 finally. Most of the two-phase R-141*b* (mainly liquid phase R-141*b*) is collected in the lower part of the collecting pipe 105 due to gravity, then flows out of the main outlet 105-1 at the bottom of the collecting pipe 105 into the heat exchanger 106. In order to equalize the pressure inside the collecting pipe 105, a small portion of the two-phase R-141*b* (mainly vapor phase R-141*b*) flows out of the auxiliary outlet 105-4 at the top of the collecting pipe 105, then joins the two-phase R-141*b* flowing from the main outlet 105-1, finally enters the heat exchanger 106.

The R-141*b* in two-phase state enters the heat exchanger 106 to exchange heat with the cooling medium. It is condensed into pure liquid phase R-141b with a certain degree of subcooling, and finally enters the liquid storage tank 107.

The liquid phase R-141b in the refrigerant storage tank 107 is pumped out again by the pump 101, forming a loop that continuously dissipates heat from the server.

The invention claimed is:

1. A high-efficiency integral heat dissipation system of high power density cabinet, comprising:
a refrigerant circulation loop, and
an air circulation loop,
wherein:
the refrigerant circulation loop includes:
a pump-driven two-phase circulation loop including a refrigerant storage tank (1), a liquid pump (2), a first three-way valve (3), a throttling device (4), an air-cooling evaporator (5), a second three-way valve (6), a third three-way valve (8), a Y three-way valve (9), and a condenser (10); and
a vapor compression circulation loop including the refrigerant storage tank (1), the liquid pump (2), the first three-way valve (3), the throttling device (4), the air-cooling evaporator (5), the second three-way valve (6), a vapor compressor (7), the third three-way valve (8), the Y three-way valve (9), and the condenser (10),
the air circulation loop includes a fan (11), the air-cooling evaporator (5), and an air circulation duct (13) formed by enclosure of the cabinet,
wherein when the pump-driven two-phase circulation loop is in use, a first passage connecting the air-cooling evaporator (5) to the compressor (7) and a second passage connecting the compressor (7) to the Y three-way valve (9) are cut off using the second three-way valve (6) and the third three-way valve (8) respectively, a third passage between the air-cooling evaporator (5) and the Y three-way valve (9) is opened, and liquid phase refrigerant in the refrigerant storage tank (1), driven by the liquid pump (2), enters the throttling device (4) through the first three-way valve (3) and expands in the throttling device (4) to drop in a temperature of the liquid-phase refrigerant as a pressure of the liquid-phase refrigerant drops, and the low-temperature refrigerant enters the air-cooling evaporator (5) and absorbs heat carried by hot air through phase change in the air-cooling evaporator (5), and the refrigerant, after the refrigerant flows through the air-cooling evaporator (5), becomes gas-liquid two-phase refrigerant, which flows through the Y three-way valve (9) and then enters the condenser (10) to condense into liquid phase, and the liquid phase refrigerant returns to the refrigerant storage tank, so the refrigerant circulates in the above components in sequence to form a pump-driven two-phase circulation loop in an air-cooling system of the cabinet to continuously dissipate the heat through circulation;
wherein when the vapor compression circulation loop is used, the third passage between the air-cooling evaporator and the Y three-way valve is cut off using the second three-way valve and the third three-way valve, the first passage between the air-cooling evaporator (5) to the compressor and the second passage between the compressor and the Y-shaped three-way valve are opened, and the liquid-phase refrigerant in the refrigerant storage tank, driven by the liquid pump, enters the throttling device (4) through the first three-way valve to drop in a temperature of the liquid-phase refrigerant as a pressure of the liquid-phase refrigerant drops, the low-temperature refrigerant enters the air-cooling evaporator to absorb the heat carried by hot air through phase change in the air-cooling evaporator, and the refrigerant, after the refrigerant flows through the air-cooling evaporator (5), becomes gas-liquid two-phase refrigerant, which reaches an inlet of the compressor (7) through a pipeline, passes through a gas-liquid separation processor at the inlet of the compressor to turn the refrigerant into gas phase refrigerant, and the gas phase refrigerant enters the compressor to be compressed, and then the compressed refrigerant flows through the Y-type three-way valve to enter the condenser and condenses into liquid phase, and then the liquid phase refrigerant returns to the refrigerant storage tank, so that the refrigerant forms a circulation by the vapor compression circulation loop in the air-cooling system of the cabinet to continuously dissipate the heat.

2. The high-efficiency integral heat dissipation system according to claim 1, wherein:
the cabinet comprises a plurality of layers of servers, wherein each server includes a motherboard; and
in the air circulation loop, hot air (3-3), driven by the fan (11), passes through the air-cooling evaporator, where the heat carried by the hot air is absorbed by the refrigerant and the hot air is cooled to become cold air (3-1), which, by closed cabinet (13), flows to the motherboard (3-2) of each layer, and since the density of cold air is higher than that of hot air, the cold air flowing upward plays the role of making airflows in a horizontal direction of each layer even; and the cold air, in the process of flowing through the motherboard of each layer, absorbs heat of a secondary heating elements on the motherboard of each layer to become hot air (3-3), which, by the closed cabinet, flows to the fan, and the air circulates in the circulation loop to continuously dissipate the heat of the secondary heating element.

3. The high-efficiency integral heat dissipation system according to claim 1, wherein:
a position of the refrigerant storage tank in the direction of gravity is lower than the condenser, and a position of the liquid pump in the direction of gravity is lower than the refrigerant storage tank.

4. The high-efficiency integral heat dissipation system according to claim 1, wherein:
the cabinet comprises a plurality of layers of servers, wherein each layer of server includes a server heat dissipation unit, a local resistance element is provided in the pipeline in front of an inlet of the server heat dissipation unit (104) of each layer, and a local resistance provided by the local resistance element of an upper server heat dissipation unit (104) is less than that provided by the local resistance element of a lower server heat dissipation unit (104).

5. The high-efficiency integral heat dissipation system according to claim 4, wherein:
a flow resistance of the refrigerant of the server heat dissipation unit (104) of each layer is adjusted by using a series and/or parallel connection of micro-channel heat exchangers (104-1).

6. The high-efficiency integral heat dissipation system according to claim 1, wherein:
R-141b, with boiling point at the normal pressure being 32° C., is selected as the refrigerant; a plate heat exchanger is selected as a heat exchanger; the cabinet used is a standard 42U cabinet containing 30 1U servers, the 1U servers are arranged in succession from top to bottom, and two CPUs chips needing heat dissipation are in each 1U server, with the specific process including:
in a high-power chip heat dissipation system with the pump-driven two-phase circulation loop of the high-efficiency integral heat dissipation system of high power density cabinet, the liquid phase R-141*b* refrigerant, by phase change in micro-channel heat exchangers, cools the CPUs in the cabinet.

7. The high-efficiency integral heat dissipation system according to claim 2, wherein:
the air-cooling evaporator and fan are on a top of the cabinet or a back of the cabinet.

8. The high-efficiency integral heat dissipation system according to claim 1, wherein:
the cabinet comprises a plurality of layers of servers, wherein each layer of server includes a server heat dissipation unit, and a flow resistance of the refrigerant of the server heat dissipation unit (104) of each layer is adjusted by using a series and/or parallel connection of micro-channel heat exchangers (104-1).

\* \* \* \* \*